(12) United States Patent
Lo et al.

(10) Patent No.: US 10,103,285 B1
(45) Date of Patent: Oct. 16, 2018

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Wen-Shun Lo, Hsinchu County (TW); Felix Ying-Kit Tsui, Cupertino, CA (US); Hsueh-Liang Chou, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/486,844

(22) Filed: Apr. 13, 2017

(51) Int. Cl.
| | |
|---|---|
| *H01L 29/732* | (2006.01) |
| *H01L 31/109* | (2006.01) |
| *H01L 31/107* | (2006.01) |
| *H01L 31/0352* | (2006.01) |
| *H01L 29/06* | (2006.01) |
| *H01L 31/18* | (2006.01) |

(52) U.S. Cl.
CPC ........ *H01L 31/107* (2013.01); *H01L 29/0619* (2013.01); *H01L 31/03529* (2013.01); *H01L 31/18* (2013.01)

(58) Field of Classification Search
CPC ............. H01L 29/0615; H01L 29/0646; H01L 29/8611; H01L 29/66136; H01L 29/8613; H01L 27/0629; H01L 2924/12036; H01L 21/761
USPC ........................................ 257/183, 186, 199
See application file for complete search history.

(56) References Cited

U.S. PATENT DOCUMENTS

| | | | |
|---|---|---|---|
| 9,728,667 B1 * | 8/2017 | Johnson | ............... H01L 31/1075 |
| 2012/0205731 A1 * | 8/2012 | Henderson | ............ H01L 31/107 |
| | | | 257/292 |

* cited by examiner

*Primary Examiner* — Hsien Ming Lee
(74) *Attorney, Agent, or Firm* — WPAT, P.C., Intellectual Property Attorneys; Anthony King

(57) ABSTRACT

A semiconductor device includes a substrate, a buried doped layer, a first doped well, a multiplication region and a first contact doped region. The substrate has a first doping type, wherein the substrate includes a surface. The buried doped layer is in the substrate and exposed from the surface of the substrate, wherein the buried doped layer has a second doping type opposite to the first doping type. The first doped well is over the buried doped layer, wherein the first doped well has the first doping type. The multiplication region is proximal to an interface between the buried doped layer and the first doped well. The first contact doped region is over the first doped well, wherein the first contact doped region has the first doping type and a doped concentration higher than a doped concentration of the first doped well.

20 Claims, 11 Drawing Sheets

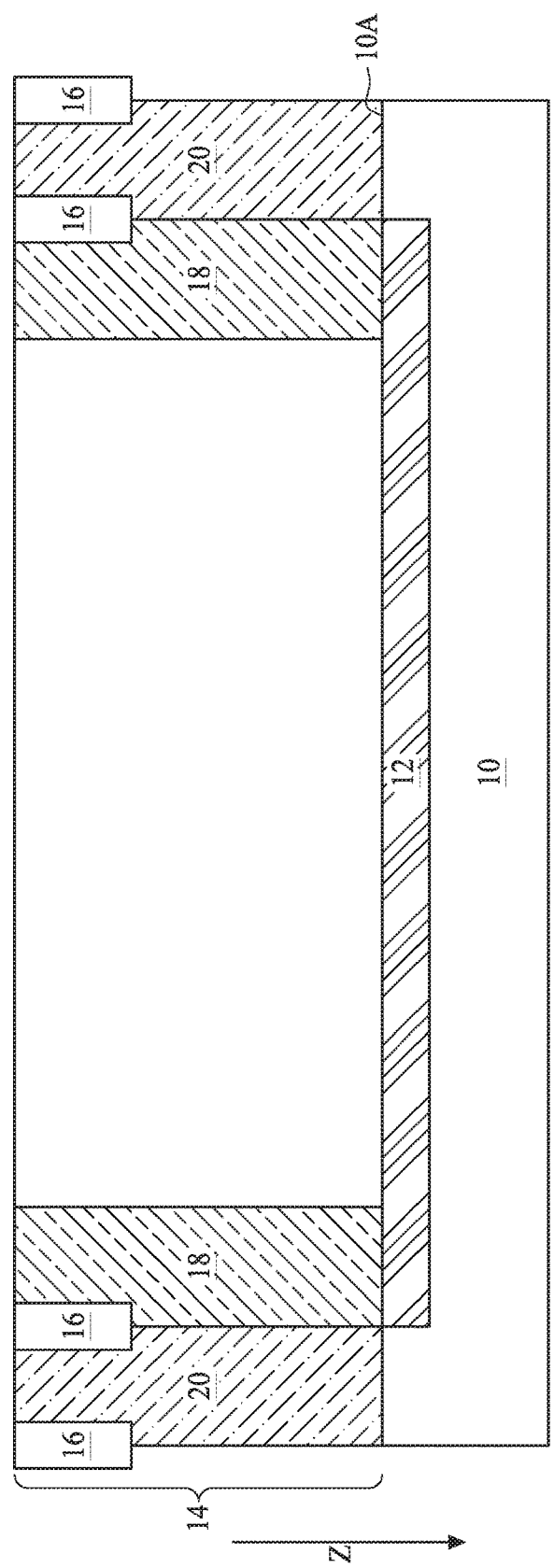

SEMICONDUCTOR DEVICE AND METHOD OF MANUFACTURING THE SAME

BACKGROUND

Avalanche photodiode (APD) has been widely introduced as a highly-sensitive light receiving device. The APD has a high response speed, the function of an amplifier, high quantum efficiency and a comparatively low operational voltage. The APD has a shallow junction depth compared to the absorption depth of an electromagnetic wave with long wavelength such as near-infra-red (NIR). Thus, the photo detection probability is much lower for NIR light.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 2A, FIG. 2B, FIG. 2C, FIG. 2D, FIG. 2E, FIG. 2F, FIG. 2G, FIG. 2H, FIG. 2I and FIG. 2J are schematic views at one of various operations of manufacturing a semiconductor device according to one or more embodiments of the present disclosure.

DETAILED DESCRIPTION

Figure 1:
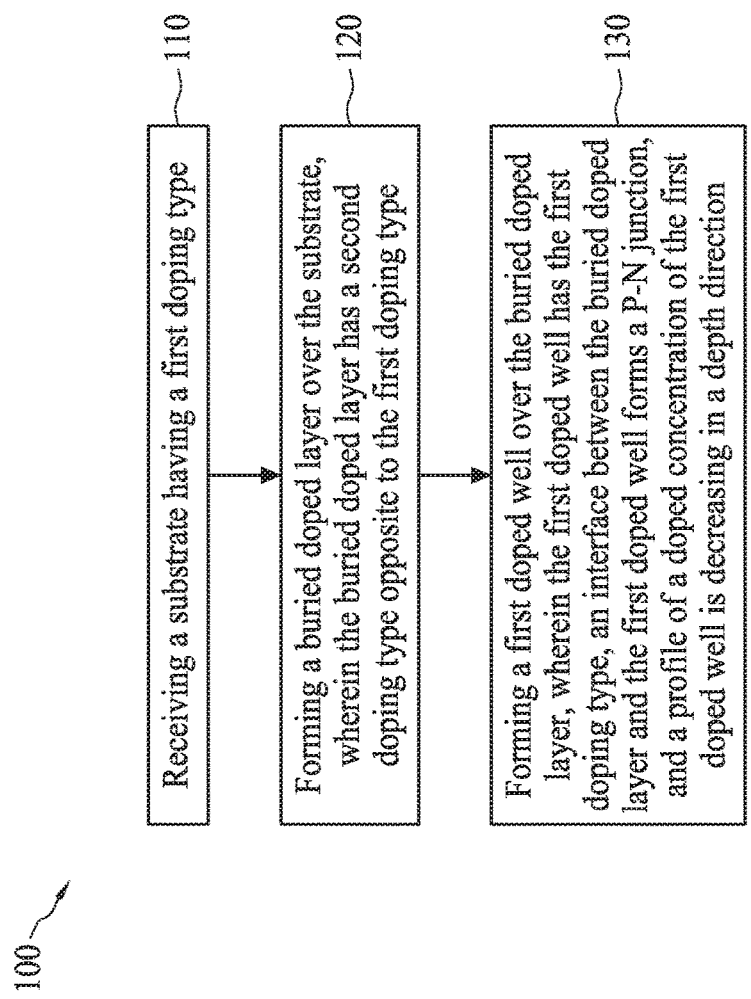
FIG. 1 is a flow chart illustrating a method of manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In one or more embodiments of the present disclosure, the semiconductor device may include a photo diode such as a single photon avalanche photo diode. The semiconductor device may include a deep multiplication region between a buried doped layer and a doped well. The deep multiplication region may be configured to increase collection of photo generated carriers induced by an electromagnetic wave with long wavelength such as near-infra-red (NIR), and thus photo detection probability can be improved. In one or more embodiments of the present disclosure, the doped concentration of the doped well has a decreasing gradient in the depth direction, which is configured to drive the minority carriers such as electrons to the multiplication region, and thus the photo detection probability can be further increased. In one or more embodiments of the present disclosure, the buried doped layer is an N+ doped layer, while the doped well is a P doped well, which forms an N+/P diode. The avalanche is mainly initiated in the P doped well by electrons, which have about two times avalanche probability than the holes, and thus the photo detection probability can be further increased.

FIG. 1 is a flow chart illustrating a method of manufacturing a semiconductor device according to various aspects of one or more embodiments of the present disclosure. The method 100 begins with operation 110 in which a substrate is received. In some embodiments, the substrate may include a semiconductor substrate a substrate having a first doping type. The method proceeds with operation 120 in which a buried doped layer is formed over the substrate. The buried doped layer has a second doping type opposite to the first doping type. In some embodiments, the buried doped layer may be buried in the substrate, and exposed from a surface of the substrate. The method proceeds with operation 130 in which a first doped well is formed over the buried doped layer. In some embodiments, the first doped well has the first doping type, an interface between the buried doped layer and the first doped well forms a P-N junction, and a profile of a doped concentration of the first doped well is decreasing in a depth direction.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
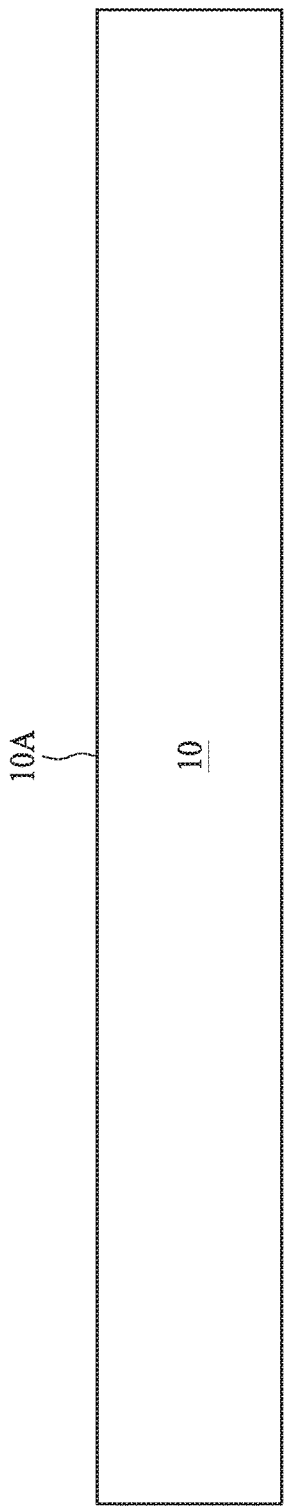

FIG. 2A, FIG. 2B, FIG. 2C, FIG. 2D, FIG. 2E, FIG. 2F, FIG. 2G, FIG. 2H, FIG. 2I and FIG. 2J are schematic views at one of various operations of manufacturing a semiconductor device according to one or more embodiments of the present disclosure. As depicted in FIG. 2A, a substrate 10 is received. In some embodiments, the substrate 10 includes a semiconductor substrate. By way of example, the material of the substrate 10 may include elementary semiconductor such as silicon or germanium; a compound semiconductor such as silicon germanium, silicon carbide, gallium arsenic, gallium phosphide, indium phosphide or indium arsenide; or combinations thereof. In some embodiments, the substrate 10 may include silicon-on-insulator (SOI) substrate, a germanium-on-insulator (GOI) substrate, or the like. The substrate 10 includes a surface 10A. In some embodiments, the substrate 10 has a first doping type. In some embodiments, the first doping type is P type, but not limited thereto. In some embodiments, the substrate 10 may be lightly doped with P-type dopants such as Boron or the like. In some embodiments, the substrate 10 may be doped e.g., by ion implantation, but not limited thereto. In some embodiments, the doped concentration of the substrate 10 may be substantially ranging from about $10^{15}$ atoms/cm$^3$ to about $10^{16}$ atoms/cm$^3$, but not limited thereto.

Figure 2B:
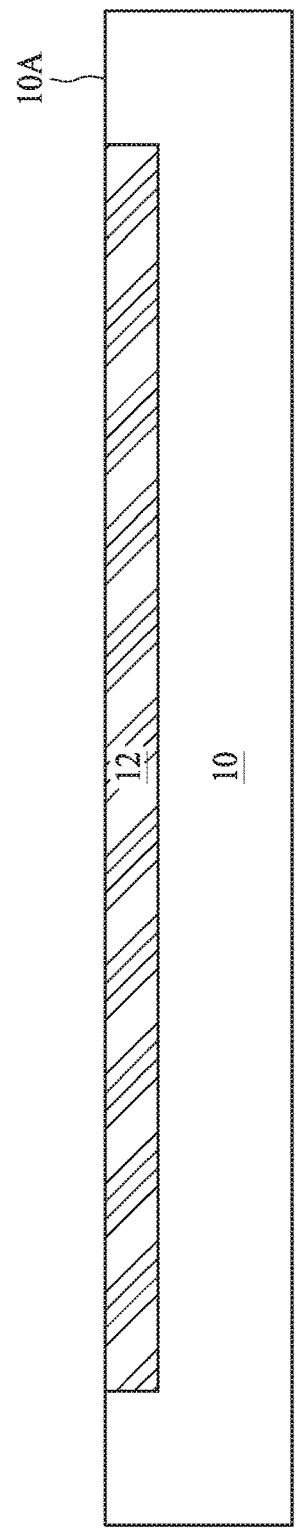

As depicted in FIG. 2B, a buried doped layer 12 is formed over the substrate 10. In some embodiments, the buried doped layer 12 has a second doping type opposite to the first doping type. By way of examples, the first doping type is P type, and the second doping type is N type, but not limited thereto. In some alternative embodiments, the first doping type may be N type, and the second doping type may be P type. In some embodiments, the buried doped layer 12 is buried in the substrate 10, and exposed from the surface 10A of the substrate 10. In some embodiments, the buried doped layer 12 may be heavily doped with N type dopants such as Phosphorous, Arsenic or the like. In some embodiments, the buried doped layer 12 may be doped e.g., by ion implantation, but not limited thereto. The doped concentration of the buried doped layer 12 is higher than the doped concentration of the substrate 10. In some embodiments, the doped concentration of the buried doped layer 12 may be substantially ranging from about $10^{18}$ atoms/cm$^3$ to about $10^{19}$ atoms/cm$^3$, but not limited thereto. In some embodiments, the thickness of the buried doped layer 12 is substantially ranging from about 1 micrometer to about 8 micrometers, or substantially ranging from about 3 micrometers to about 8 micrometers, but not limited thereto.

Figure 2C:
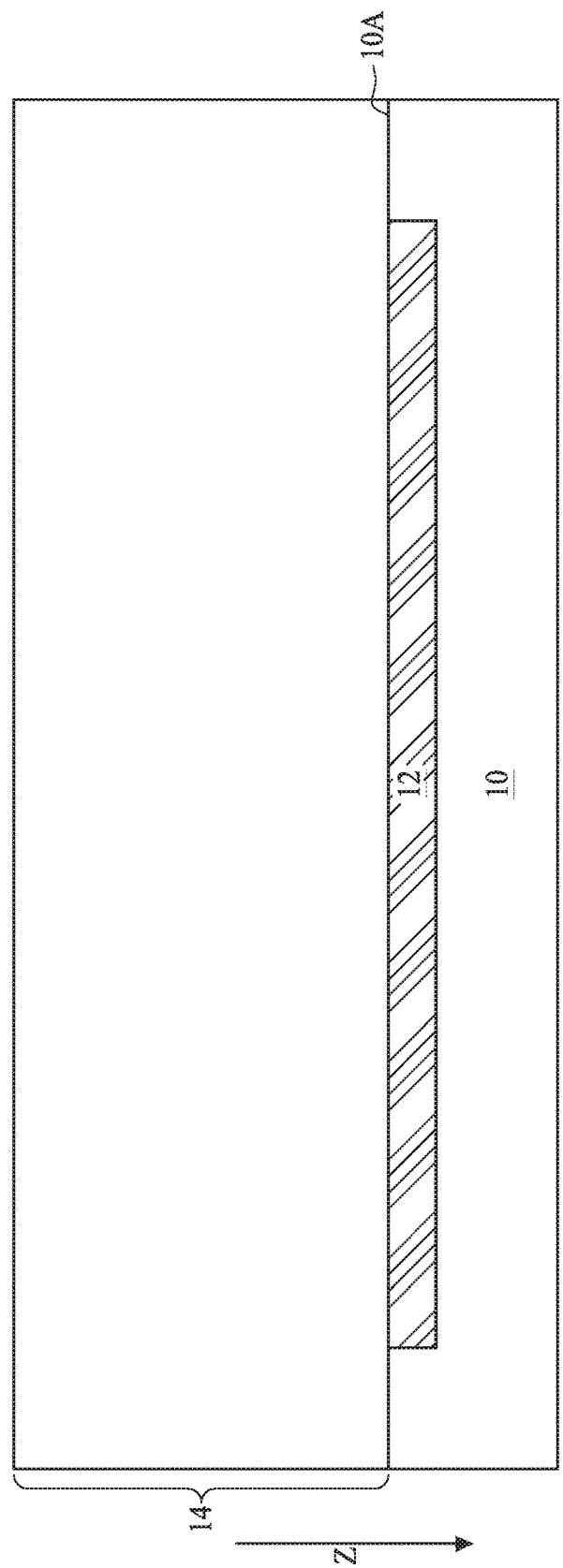

As depicted in FIG. 2C, a semiconductive layer 14 is formed over the substrate 10 and the buried doped layer 12. In some embodiments, the semiconductive layer 14 includes an epitaxial semiconductive layer epitaxially grown on the substrate 10 and the buried doped layer 12, but not limited thereto. In some embodiments, the semiconductive layer 14 includes an epitaxial silicon layer. In some embodiments, the thickness of the semiconductive layer 14 is substantially larger than or equal to about 3 micrometers, larger than or equal to about 4 micrometers, or larger than or equal to about 5 micrometers. In some embodiments, the thickness of the semiconductive layer 14 is substantially ranging from about 3 micrometers to about 8 micrometers, or substantially ranging from about 5 micrometers to about 8 micrometers, but not limited thereto.

Figure 2D:
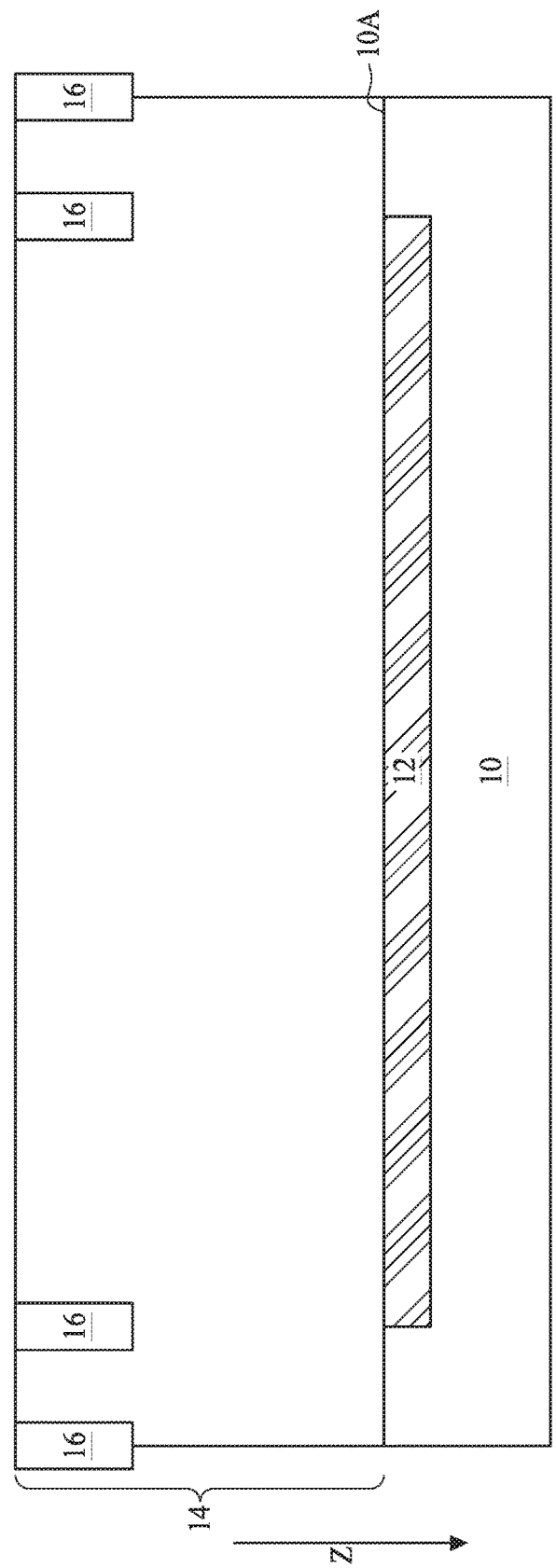
Figure 2E:
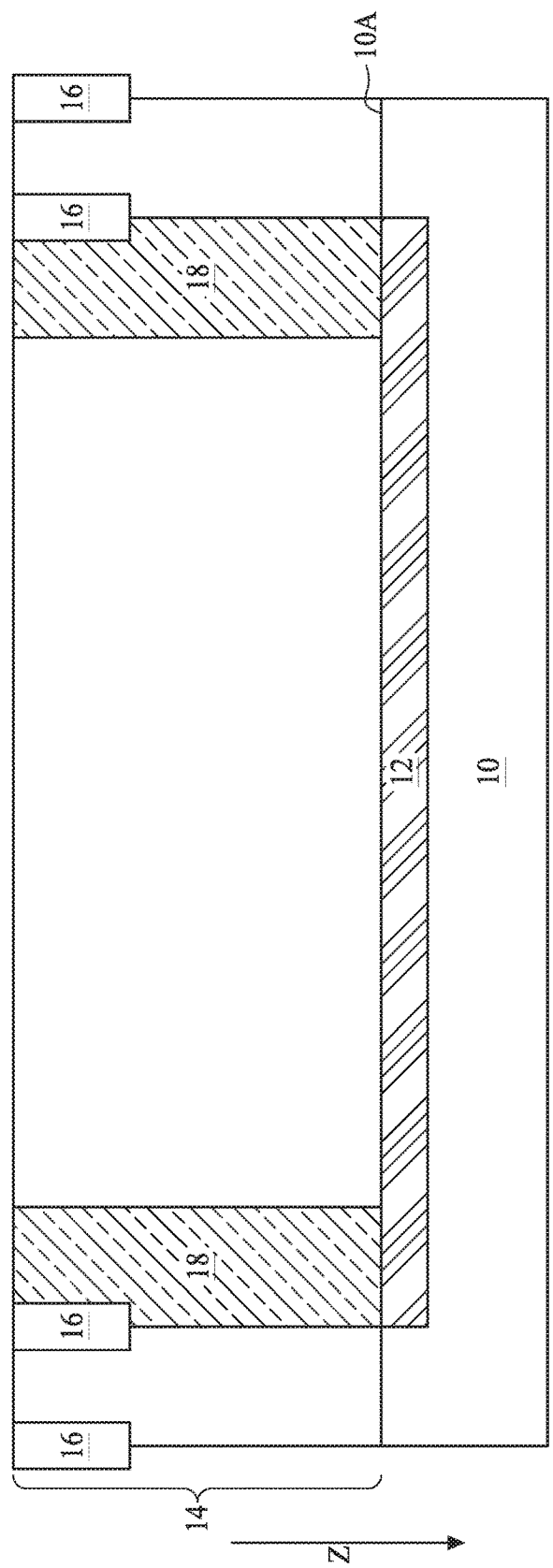

As depicted in FIG. 2D, isolation structures 16 such as shallow trench isolations (STIs) or the like may be formed in the semiconductive layer 14. As depicted in FIG. 2E, a second doped well 18 may be formed over the buried doped layer 12. In some embodiments, the second doped well 18 may be formed over at least two opposite edges of the buried doped layer 12. In some embodiments, the second doped well 18 may be formed over a perimeter of the buried doped layer 12. In some embodiments, the second doped well 18 has the second doping type, and the doped concentration of the second doped well 18 is lower than the doped concentration of the buried doped layer 12. In some embodiments, the doped concentration of the second doped well 18 may be substantially ranging from about $10^{16}$ atoms/cm$^3$ to about $10^{17}$ atoms/cm$^3$, but not limited thereto. In some embodiments, the second doped well 18 may be formed in the semiconductive layer 14 e.g., by ion implantation, but not limited thereto.

As depicted in FIG. 2F, a third doped well 20 may be formed over the substrate 10 and alongside the second doped well 18. In some embodiments, the third doped well 20 has the first doping type, and the doped concentration of the third doped well 20 is higher than the doped concentration of the substrate 10. In some embodiments, the doped concentration of the third doped well 20 may be substantially ranging from about $10^{16}$ atoms/cm$^3$ to about $10^{17}$ atoms/cm$^3$, but not limited thereto. In some embodiments, the third doped well 20 may be formed in the semiconductive layer 14 e.g., by ion implantation, but not limited thereto.

Figure 2G:
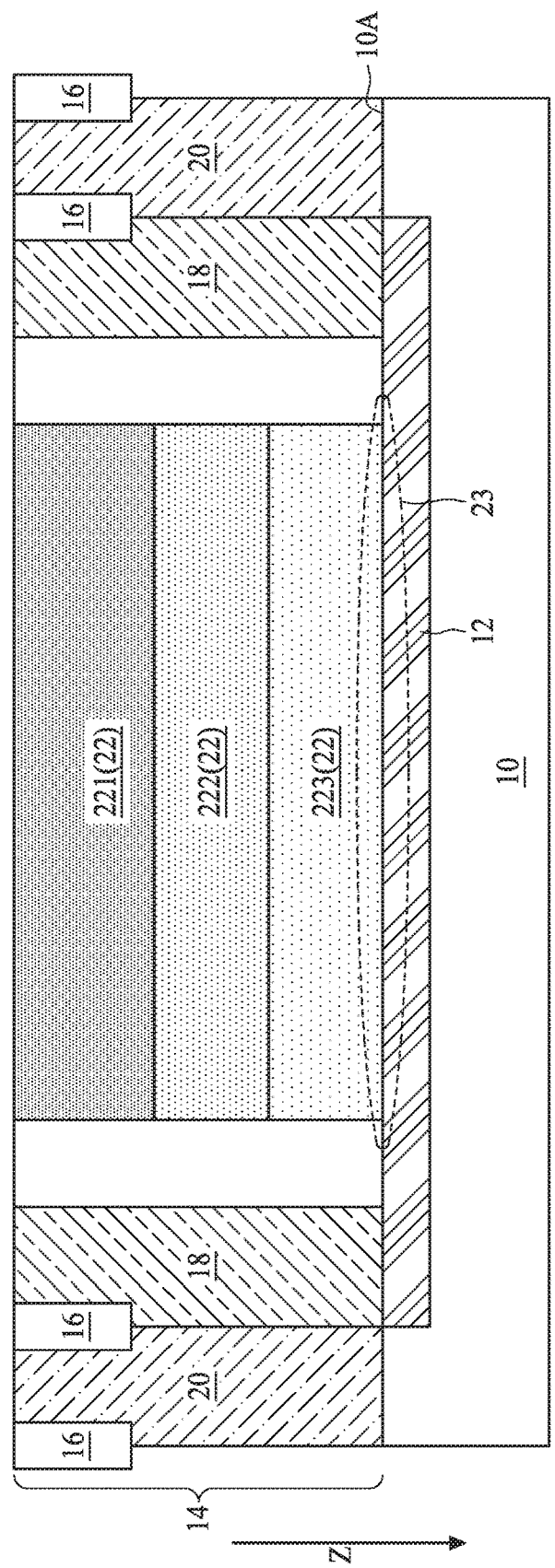

As depicted in FIG. 2G, a first doped well 22 may be formed over the buried doped layer 12. In some embodiments, the first doped well 22 has the first doping type, which is opposite to the second doping type of the buried doped layer 12. The interface between the buried doped layer 12 and the first doped well 22 forms a P-N junction. In some embodiments, the P-N junction forms a multiplication region 23 proximal to the interface between the buried doped layer 12 and the first doped well 22. In some embodiments, the depth of the multiplication region 23 is substantially larger than or equal to about 3 micrometers, larger than or equal to about 4 micrometers, or larger than or equal to about 5 micrometers. In some embodiments, the depth of the multiplication region 23 is substantially ranging from about 3 micrometers to about 8 micrometers, or substantially ranging from about 5 micrometers to about 8 micrometers but not limited thereto.

In some embodiments, the doped concentration of the first doped well 22 is higher than the doped concentration of the substrate 10. In some embodiments, the profile of the doped concentration of the first doped well 22 is decreasing in a depth direction Z, i.e., a portion of the first doped well 22 proximal to the buried doped layer 12 has a lower doped concentration, and a portion of the first doped well 22 distal to the buried doped layer 12 has a higher doped concentration. In some embodiments, the profile of the doped concentration of the first doped well 22 is monotonically decreasing. In some embodiments, the doped concentration of the first doped well 22 is decreasing in a continuous manner. In some embodiments, the doped concentration of the first doped well 22 is decreasing in a multi-stage manner.

In some embodiments, the doped concentration of the first doped well 22 may be substantially ranging from about $10^{16}$ atoms/cm$^3$ to about $10^{19}$ atoms/cm$^3$, substantially ranging from about $10^{17}$ atoms/cm$^3$ to about $10^{19}$ atoms/cm$^3$, or substantially ranging from about $10^{16}$ atoms/cm$^3$ to about $10^{18}$ atoms/cm$^3$, but not limited thereto. In some embodiments, the first doped well 22 may include several doped sub-regions having different doped concentrations located at different depths. By way of examples, a first doped sub-region 221 of the first doped well 22 having a lower doped concentration is located proximal to the buried doped layer 12. A third doped sub-region 223 of the first doped well 22 having a higher doped concentration is located distal to the buried doped layer 12. A second doped sub-region 222 of the first doped well 22 having a medium doped concentration is located between the first doped sub-region 221 and the third doped sub-region 223. In some embodiments, the first doped well 22 having the first doped sub-region 221, the second doped sub-region 222 and the third doped sub-region 223 may be formed e.g., by performing several ion implantations using different parameters such as different ion implantation energies and different dosage amounts. By way of examples, the first doped sub-region 221 may be formed by an ion implantation using higher implantation energy and lower dosage amount, the second doped sub-region 222 may be formed by an ion implantation using medium implantation energy and medium dosage amount, and the third doped sub-region 223 may be formed by an ion implantation using lower implantation energy and higher dosage amount. In some embodiments, the doped concentration of the first doped sub-region 221 may be substantially ranging from about $10^{16}$ atoms/cm$^3$ to about $10^{17}$ atoms/cm$^3$, the doped concentration of the second doped sub-region 222 may be substantially ranging from about $10^{17}$ atoms/cm$^3$ to about $10^{18}$ atoms/cm$^3$, and the doped concentration of the third doped sub-region 223 may be substantially ranging from about $10^{18}$ atoms/cm$^3$ to about $10^{19}$ atoms/cm$^3$, but not limited thereto.

Figure 2H:
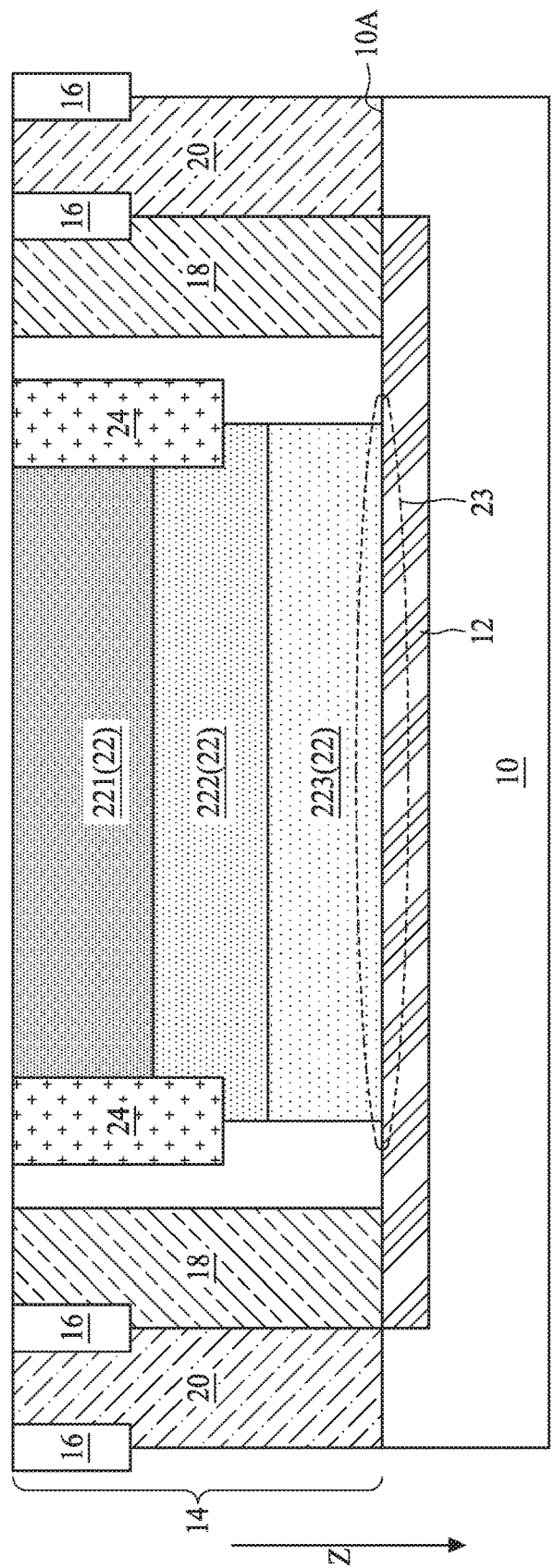

As depicted in FIG. 2H, a guard ring doped region 24 may be formed between the first doped well 22 and the second doped well 18. In some embodiments, the guard ring doped region 24 may be formed between an upper portion of the first doped well 22 and the second doped well 18. In some embodiments, the guard ring doped region 24 may be formed between the third doped sub-region 223 and the second doped well 18. In some embodiments, the depth of the guard ring region 28 may be extended downward to further dispose between the second doped sub-region 222 and the second doped well 18, or further dispose between the first doped sub-region 221 and the second doped well 18. In some embodiments, the guard ring doped region 24 has the first doping type. In some embodiments, the guard ring doped region 24 may be formed in the semiconductive layer 14 e.g., by ion implantation, but not limited thereto. In some embodiments, the doped concentration of the guard ring doped region 24 is lower than the doped concentration of the first doped well 22. In some embodiments, the doped concentration of the guard ring doped region 24 may be substantially ranging from about $10^{16}$ atoms/cm$^3$ to about $10^{17}$ atoms/cm$^3$, but not limited thereto.

Figure 2I:
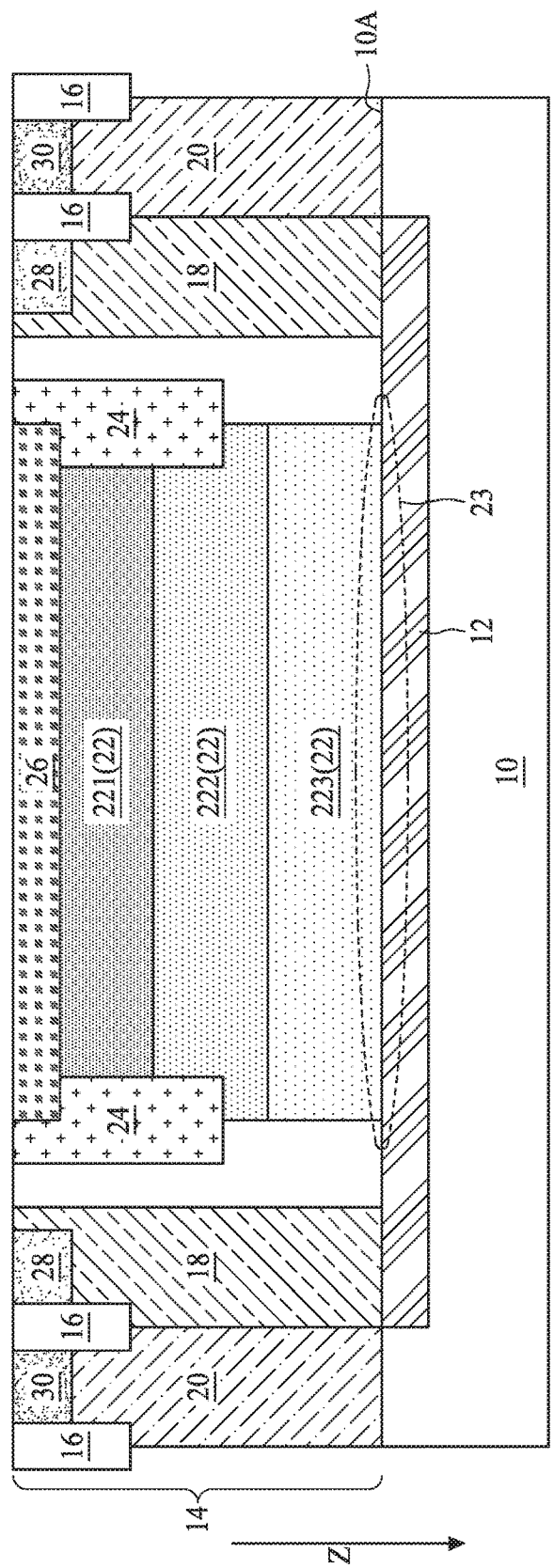

As depicted in FIG. 2I, a first contact doped region 26 may be formed over the first doped well 22. In some embodiments, the first contact doped region 26 has the first doping type. In some embodiments, the first contact doped region 26 may be formed in an upper portion of the first doped well 22 e.g., by ion implantation, but not limited thereto. In some embodiments, the doped concentration of the first contact doped region 26 is higher than the doped concentration of the first doped well 22 and the doped concentration of the guard ring doped region 24. In some embodiments, the doped concentration of the first contact doped region 26 may be substantially ranging from about $10^{19}$ atoms/cm$^3$ to about $10^{21}$ atoms/cm$^3$, but not limited thereto.

In some embodiments, a second contact doped region 28 is formed over the second doped well 18. In some embodiments, the second contact doped region 28 has the second doping type. In some embodiments, the second contact doped region 28 may be formed in an upper portion of the second doped well 18 e.g., by ion implantation, but not limited thereto. In some embodiments, the doped concentration of the second contact doped region 28 is higher than the doped concentration of the second doped well 18. In some embodiments, the doped concentration of the second contact doped region 28 may be substantially ranging from about $10^{19}$ atoms/cm$^3$ to about $10^{21}$ atoms/cm$^3$, but not limited thereto.

In some embodiments, a third contact doped region 30 is formed over the third doped well 20. In some embodiments, the third contact doped region 30 has the first doping type. In some embodiments, the third contact doped region 30 may be formed in an upper portion of the third doped well 20 e.g., by ion implantation, but not limited thereto. In some embodiments, the third contact doped region 30 and the first contact doped region 26 may be formed simultaneously, e.g. by the same ion implantation, but not limited thereto. In some embodiments, the doped concentration of the third contact doped region 30 is higher than the doped concentration of the third doped well 20. In some embodiments, the doped concentration of the third contact doped region 30 may be substantially ranging from about $10^{19}$ atoms/cm$^3$ to about $10^{21}$ atoms/cm$^3$, but not limited thereto.

Figure 2J:
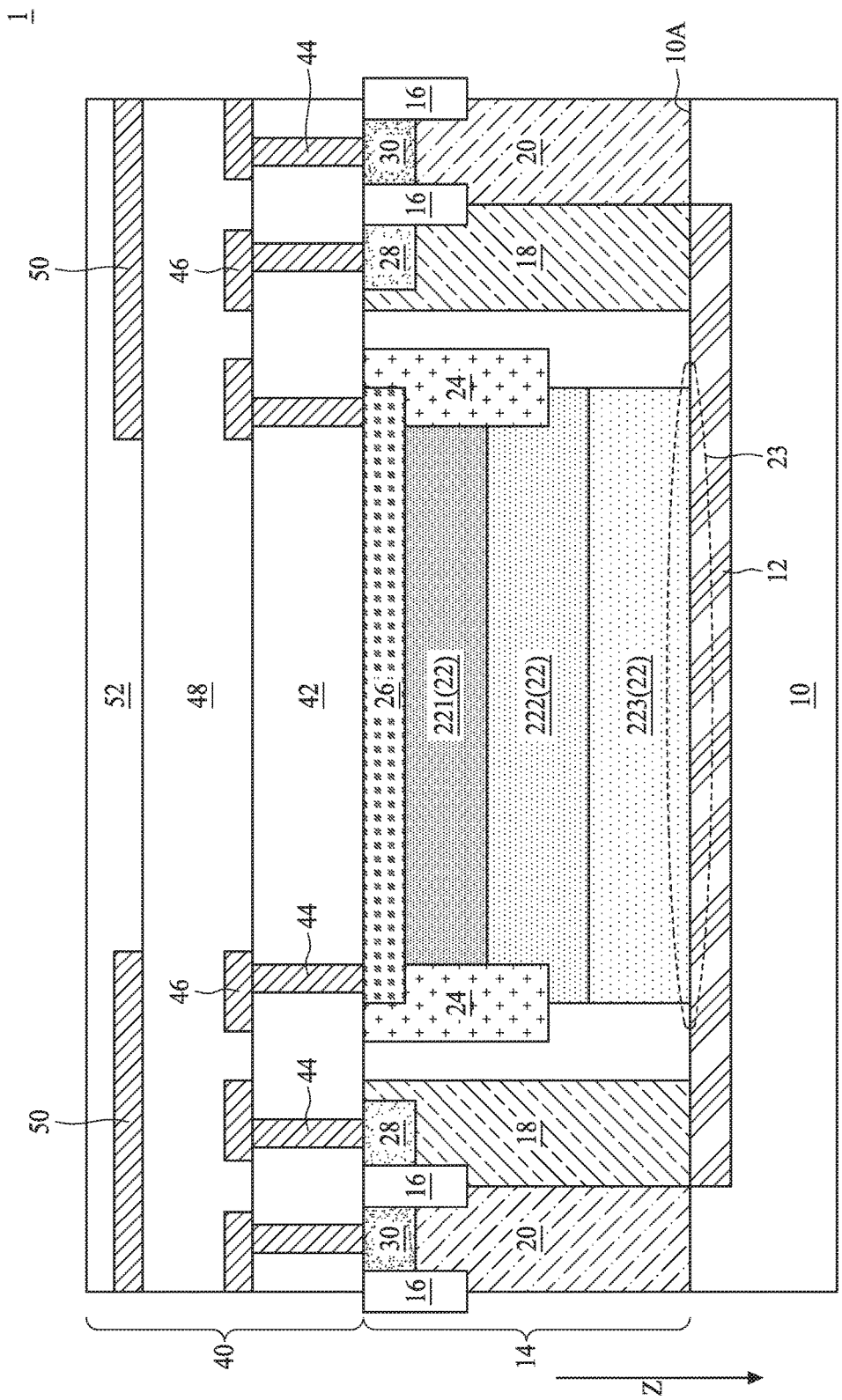

As depicted in FIG. 2J, a metal interconnection structure 40 may be formed over the semiconductive layer 14. In some embodiments, the metal interconnection structure 40 may include a first dielectric layer 42, conductive vias 44, first conductive wires 46, a second dielectric layer 48, second conductive wires 50 and a passivation layer 52. In some embodiments, the first dielectric layer 42 is formed over the semiconductive layer 14, and at least partially exposes the first contact doped region 26, the second contact doped region 28 and the third contact doped region 30. In some embodiments, the conductive vias 44 are through the first dielectric layer 42, and electrically connected to the first contact doped region 26, the second contact doped region 28 and the third contact doped region 30, respectively. In some embodiments, the first conductive wires 46 are formed over the first dielectric layer 42, and electrically connected to the conductive vias 44, respectively. In some embodiments, the second dielectric layer 48 is formed over the first dielectric layer 42 and the first conductive wires 46. In some embodiments, the second conductive wires 50 are formed over the second dielectric layer 48. In some embodiments, the second conductive wires 50 are electrically connected to the first conductive wires 46. In some embodiments, a passivation layer 52 is formed over the second dielectric layer 48 and the second conductive wires 50.

FIG. 2J is a schematic cross-sectional view illustrating a semiconductor device 1 according to one or more embodiments of the present disclosure. In some embodiments, the semiconductor device 1 may include a photo diode such as an avalanche photo diode. In some embodiments, the avalanche photo diode may include a single photon avalanche photo diode. As shown in FIG. 2J, the semiconductor device 1 of some embodiments may include a substrate 10, a buried doped layer 12, a first doped well 22 and a first contact doped region 26. In some embodiments, the buried doped layer 12 is in the substrate 10 and exposed from the surface 10A of the substrate 10. The first doped well 22 is disposed over the buried doped layer 12. In some embodiments, the first doped well 22 and the buried doped layer 12 have opposite doping types and are in contact with each other, forming a P-N junction there between. Accordingly, a photo diode is formed with a multiplication region 23 located proximal to the interface between the buried doped layer 12 and the first doped well 22. The first contact doped region 26 is disposed over the first doped well 22. The first contact doped region 26 has the same doping type as the first doped well 22, and a higher doped concentration. In some embodiments, the first contact doped region 26 is configured as an anode of the photo diode.

In some embodiments, the semiconductor device 1 may further include a second doped well 18 and a second contact doped region 28. In some embodiments, the second doped well 18 is disposed over the buried doped layer 12 and alongside the first doped well 22. In some embodiments, the second contact doped region 28 is disposed over the second doped well 18. In some embodiments, the second contact doped region 28 and the second doped well 18 have the same doping type as the buried doped layer 12. In some embodiments, the second contact doped region 28 may be configured as a cathode of the photo diode.

In some embodiments, the semiconductor device 1 may further include a guard ring doped region 24 disposed between the first doped well 22 and the second doped well 18. In some embodiments, the guard ring doped region 24 has the same doping type as the first doped well 22 and a lower doped concentration than the first doped well 22. In some embodiments, the guard ring doped region 24 is configured to increase edge breakdown voltage of the photo diode. In some embodiments, the guard ring doped region 24 is configured to reduce noise signals.

In some embodiments, the semiconductor device 1 may further include a third doped well 20 and a third contact doped region 30. In some embodiments, the third doped well 20 is disposed over the substrate 10 and alongside the second doped well 18. In some embodiments, the third contact doped region 30 is disposed over the third doped well 20. In some embodiments, the third contact doped region 30 and the third doped well 20 have the same doping type as substrate 10. In some embodiments, the third contact doped region 30 may be configured as an electrical terminal of the substrate 10. In some embodiments, the substrate 10 may be grounded through the third contact doped region 30.

As shown in FIG. 2J, the multiplication region 23 of the photodiode is proximal to the P-N junction between the buried doped layer 12 and the first doped well 22. In some embodiments, the depth of the multiplication region 23 is substantially larger than or equal to about 3 micrometers, larger than or equal to about 4 micrometers, larger than or equal to about 5 micrometers, or ranging from about 3 micrometers to about 8 micrometers. In some embodiments, for an electromagnetic wave with long wavelength such as near-infra-red (NIR) with a wavelength of about 940 nm, the penetration depth into the substrate 10 such as a silicon substrate is about 60 micrometers. The deep P-N junction is closer to a penetration depth of long wavelength incident electromagnetic wave, and thus is able to increase collection of photo generated carriers. The multiplication region 23 proximal to the P-N junction between the buried doped layer 12 and the first doped well 22 therefore is able to increase photo detection probability for long wavelength incident electromagnetic wave such as NIR or the like. In some embodiments, the doped concentration of the first doped well 22 has a decreasing gradient in the depth direction Z. The decreasing doped concentration is configured to drive the minority carriers such as electrons to the multiplication region 23, and thus the photo detection probability can be further increased. In some embodiments, the buried doped layer 12 is an N+ doped layer, while the first doped well 22 is a P doped well, which forms an N+/P diode. Accordingly, the avalanche is mainly initiated in the P type first doped well 22 by electrons, rather than holes. The electrons have about two times avalanche probability than the holes, and thus the photo detection probability can be further increased.

In some embodiments of the present disclosure, the semiconductor device may include a deep multiplication region between a buried doped layer and a doped well, which is configured to increase collection of photo generated carriers, and thus photo detection probability can be improved. In some embodiments of the present disclosure, the doped concentration of the doped well has a decreasing gradient in the depth direction, which is configured to drive the minority carriers such as electrons to the multiplication region, and thus the photo detection probability can be further increased. In some embodiments of the present disclosure, the avalanche is mainly initiated by electrons, which have about two times avalanche probability than the holes, and thus the photo detection probability can be further increased.

In one exemplary aspect, a semiconductor device includes a substrate, a buried doped layer, a first doped well, a multiplication region and a first contact doped region. The substrate has a first doping type, wherein the substrate includes a surface. The buried doped layer is in the substrate and exposed from the surface of the substrate, wherein the buried doped layer has a second doping type opposite to the first doping type. The first doped well is over the buried doped layer, wherein the first doped well has the first doping type. The multiplication region is proximal to an interface between the buried doped layer and the first doped well. The first contact doped region is over the first doped well, wherein the first contact doped region has the first doping type and a doped concentration higher than a doped concentration of the first doped well.

In another aspect, a semiconductor device includes a substrate, a buried doped layer and a first doped well. The substrate has a first doping type. The buried doped layer is over the substrate, wherein the buried doped layer has a second doping type opposite to the first doping type. The first doped well is over the buried doped layer, wherein the first doped well has the first doping type, an interface between the buried doped layer and the first doped well forms a P-N junction, and a profile of the doped concentration of the first doped well is decreasing in a depth direction.

In yet another aspect, a method for manufacturing a semiconductor device is provided. A substrate having a first doping type is received. A buried doped layer is formed over the substrate. The buried doped layer has a second doping type opposite to the first doping type. A first doped well is formed over the buried doped layer. The first doped well has the first doping type, an interface between the buried doped layer and the first doped well forms a P-N junction, and a profile of a doped concentration of the first doped well is decreasing in a depth direction.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a first doping type, wherein the substrate includes a surface;
   a buried doped layer in the substrate and exposed from the surface of the substrate, wherein the buried doped layer has a second doping type opposite to the first doping type;
   a first doped well over the buried doped layer, wherein the first doped well has the first doping type, the first doped well comprises a first doped sub-region proximal to the buried doped layer, and a second doped sub-region distal to the buried doped layer, and a doped concentration of the first doped sub-region is lower than that of the second doped sub-region;
   a multiplication region proximal to an interface between the buried doped layer and the first doped well; and
   a first contact doped region over the first doped well, wherein the first contact doped region has the first doping type and a doped concentration higher than a doped concentration of the first doped well.

2. The semiconductor device of claim 1, wherein a profile of the doped concentration of the first doped well is decreasing from an interface between the first contact doped region and the first doped well to the interface between the buried doped layer and the first doped well.

3. The semiconductor device of claim 2, wherein the profile of the doped concentration of the first doped well is monotonically decreasing from the interface between the first contact doped region and the first doped well to the interface between the buried doped layer and the first doped well.

4. The semiconductor device of claim 1, further comprising a second doped well over the buried doped layer and alongside the first doped well, wherein the second doped well has the second doping type and a doped concentration lower than a doped concentration of the buried doped layer.

5. The semiconductor device of claim 4, further comprising a second contact doped region over the second doped well, wherein the second contact doped region has the second doping type and a doped concentration higher than the doped concentration of the buried doped layer.

6. The semiconductor device of claim 4, further comprising a guard ring doped region between the first doped well and the second doped well, wherein the guard ring doped region has the first doping type, and a doped concentration lower than the doped concentration of the first doped well.

7. The semiconductor device of claim 4, further comprising a third doped well over the substrate and alongside the second doped well, wherein the third doped well has the first doping type and a doped concentration higher than a doped concentration of the substrate.

8. The semiconductor device of claim 7, further comprising a third contact doped region over the third doped well, wherein the third contact doped region has the first doping type and a doped concentration higher than the doped concentration of the third doped well.

9. The semiconductor device of claim 1, wherein the first doping type is P type, and the second doping type is N type.

10. A semiconductor device, comprising:
    a substrate having a first doping type;
    a buried doped layer over the substrate, wherein the buried doped layer has a second doping type opposite to the first doping type; and
    a first doped well over the buried doped layer, wherein the first doped well has the first doping type, an interface between the buried doped layer and the first doped well forms a P-N junction, and a profile of the doped concentration of the first doped well is decreasing in a depth direction.

11. The semiconductor device of claim 10, wherein a depth of the P-N junction is substantially larger than or equal to about 3 micrometers.

12. The semiconductor device of claim 10, wherein the profile of the doped concentration of the first doped well is monotonically decreasing in the depth direction.

13. The semiconductor device of claim 10, further comprising a first contact doped region over the first doped well, wherein the first contact doped region has the first doping type and a doped concentration higher than a doped concentration of the first doped well.

14. The semiconductor device of claim 10, further comprising a second doped well over the buried doped layer and alongside the first doped well, wherein the second doped well has the second doping type and a doped concentration lower than a doped concentration of the buried doped layer.

15. The semiconductor device of claim 14, further comprising a second contact doped region over the second doped well, wherein the second contact doped region has the second doping type and a doped concentration higher than the buried doped layer.

16. The semiconductor device of claim 14, further comprising a guard ring doped region between the first doped well and the second doped well, wherein the guard ring doped region has the first doping type, and a doped concentration lower than the doped concentration of the first doped well.

17. The semiconductor device of claim 14, further comprising a third doped well over the substrate and alongside the second doped well, wherein the third doped well has the first doping type and a doped concentration higher than a doped concentration of the substrate.

18. The semiconductor device of claim 17, further comprising a third contact doped region over the third doped well, wherein the third contact doped region has the first doping type and a doped concentration higher than the doped concentration of the third doped well.

19. A method of manufacturing a semiconductor device, comprising:
    receiving a substrate having a first doping type;
    forming a buried doped layer over the substrate, wherein the buried doped layer has a second doping type opposite to the first doping type; and
    forming a first doped well over the buried doped layer, wherein the first doped well has the first doping type, an interface between the buried doped layer and the first doped well forms a P-N junction, and a profile of a doped concentration of the first doped well is decreasing in a depth direction.

20. The method of claim 19, wherein forming the first doped well comprises performing a plurality of ion implantations using different ion implantation energies and different dosage amounts.

* * * * *